United States Patent [19]

Hsu et al.

[11] Patent Number: 5,616,946

[45] Date of Patent: Apr. 1, 1997

[54] VLSI ROM PROGRAMMED BY SELECTIVE DIODE FORMATION

[75] Inventors: Chen-Chung Hsu, Taichung; Gary Hong, Hsinchu, both of Taiwan

[73] Assignee: United Microelectronics Corporation, Hsin-Chu, Taiwan

[21] Appl. No.: 597,542

[22] Filed: Apr. 25, 1996

Related U.S. Application Data

[62] Division of Ser. No. 374,967, Jan. 19, 1995, Pat. No. 5,550,075.

[51] Int. Cl.⁶ .................................................. H01L 27/112
[52] U.S. Cl. ........................ 257/390; 257/391; 257/910
[58] Field of Search ................................. 257/389, 390, 257/391, 910, 395

[56] References Cited

U.S. PATENT DOCUMENTS

| 5,108,937 | 4/1992 | Tsai et al. ................................. 437/40 |
| 5,236,853 | 8/1993 | Hsue ............................................ 437/43 |
| 5,264,386 | 11/1993 | Yang ............................................ 437/52 |
| 5,308,777 | 5/1994 | Hong ............................................ 437/41 |
| 5,308,781 | 5/1994 | Ando et al. ............................. 257/390 |
| 5,334,543 | 8/1994 | Lin et al. .................................. 437/30 |
| 5,429,975 | 7/1995 | Sheu et al. ................................ 437/52 |

FOREIGN PATENT DOCUMENTS 60-130162  7/1985  Japan .................................. 257/910

*Primary Examiner*—Minh-Loan Tran
*Attorney, Agent, or Firm*—William H. Wright

[57] ABSTRACT

A method for fabricating read only memory, (ROM), devices, has been developed. The programmable cell of this ROM device is comprised of a P/N diode, place in a N+ buried bit line. The diode formation is accomplished using outdiffusion from a P+ polysilicon wordline, that is in direct contact to a specific bit line region.

4 Claims, 3 Drawing Sheets

VLSI ROM PROGRAMMED BY SELECTIVE DIODE FORMATION

This is a divisional of application Ser. No. 08/374,967, filed Jan. 19, 1995, now U.S. Pat. No. 5,550,075.

BACKGROUND OF THE INVENTION

1. Field of the Invention

The present invention relates to the fabrication of integrated circuit devices, and more specifically to a method of making read only memory, (ROM), devices.

2. Description of Prior Art

Read only memory, (ROM), devices have benefited from shrinking cell size, and process optimizations. The buried bit line ROM cell has been the most widely used in the industry. This is accomplished using heavily doped N type diffusions. The word lines, used in most ROM configurations, have usually consisted of polysilicon structures. The dimension of the ROM cell is determined by the pitches of the polysilicon word lines, used to connect to N+ bit lines. Advances in photolithographic disciplines, via use of more sophisticated cameras, as well as the use of more sensitive photoresist materials, have allowed critical ROM dimensions to decrease. In addition, similar developments in reactive ion etching, (RIE), ion implantation, (I/I), and low pressure chemical vapor deposition techniques, have also contributed to the decreasing ROM cell size. However the ability to continue to shrink cell size is still limited using even the most advanced fabrication disciplines. For example if the space between the N+ buried bit line becomes too narrow, the N+ concentration has to be reduced to avoid short channel punch through. However the reduced N+ concentration will result in more sensitivity to P type counterdoping, during the programming of the channel region.

Several processes have been created that can successfully allow heavy N+ bit lines, while still maintaining narrow spacings. In U.S. Pat. No. 5,308,777, Hong describes a process in which only the center portion of the channel region is subjected to a P type programming ion implantion procedure. Thus little, or no interaction of dopants occur, while still maintaining minimum bit line spacings. This procedure, although resulting in the desired reduction of ROM cell size, requires additional processing and thus additional costs. Therefore ROM processes that do not incorporate the programmable cell, achieved via P type ion implantion into the channel region between the N+ bit lines, would be desirable.

A ROM process, described in this invention can result in narrow N+ bit line spacings, due to the elimination of the P type programmable ion implantion in the channel region. This invention will show a ROM device in which the programmable cell is achieved by forming a diode in specific regions of the N+ bit line.

SUMMARY OF THE INVENTION

It is an object of this invention to provide an effective and manufacturable method to fabricate read only memory, (ROM), devices.

It is another object of this invention to fabricate ROM devices that have narrow spacings between N+ buried bit lines.

It is still another object of this invention to fabricate ROM devices in which the programmable cell is obtained by a diode placed in specific regions of the N+ buried bit line.

In accordance with this invention, a new method of forming closely spaced, buried bit lines, is achieved. The method involves forming heavily doped arsenic and phosphorous regions, in a substrate, using ion implantation processing for purposes of creating the buried bit lines of the device. An insulator film is thermally grown, thicker on the N+ regions, then on the substrate surface. The patterning of the insulator layer, over specific regions of the N+ bit lines, is followed by removal of the insulator in that region. A polysilicon deposition, followed by a heavily doped boron ion implantation procedure, ultimately result in diode formation in regions in which the insulator had been removed. Patterning of the polysilicon layer results in the word line configuration. Insulator deposition, patterning to open vias to the appropriate elements, metallization, and patterning of the metallization to form contacts to the bit and word lines, complete the fabrication process.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

The method of fabricating ROM devices, with the programmable cell created by use of a P/N diode, will now be covered in detail. This P/N diode, programmable cell, can be used as part of ROM devices that are now currently manufactured in industry, therefore only specific areas unique to understanding this invention will be described in detail.

Figure 1:
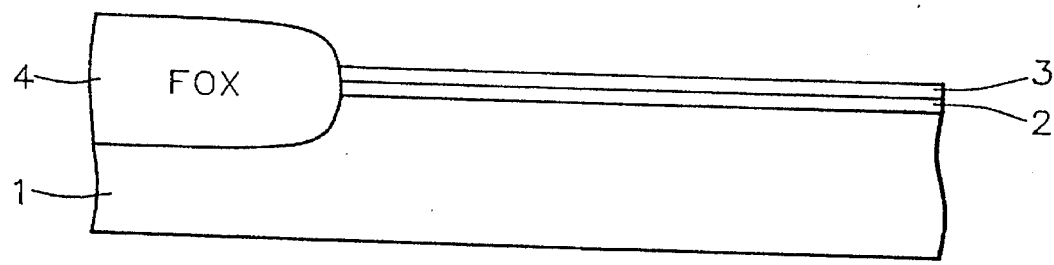
FIGS. 1–6, which schematically illustrate, in cross-sectional style, the various stages of fabrication of this new ROM device.

A substrate, 1, composed of P type single crystal silicon, with a <100> orientation, is used and shown in FIG. 1. A thick field oxide, (FOX), for isolating specific areas of the device, is first formed surrounding the region where the device is to be built. Briefly the method commonly practiced in the industry is the use of a thin silicon dioxide layer, (pad oxide), 2, with an overlying silicon nitride layer, 3, which serves as the oxidation mask. The desired field oxide regions are etched open in the silicon nitride—silicon dioxide layer using conventional photolithographic and dry etching processing. After removal of the masking photoresist, and a wet chemical cleaning, a field oxide, 4, is grown, typically to a thickness of between about 4000 to 6000 Angstroms.

Figure 2:
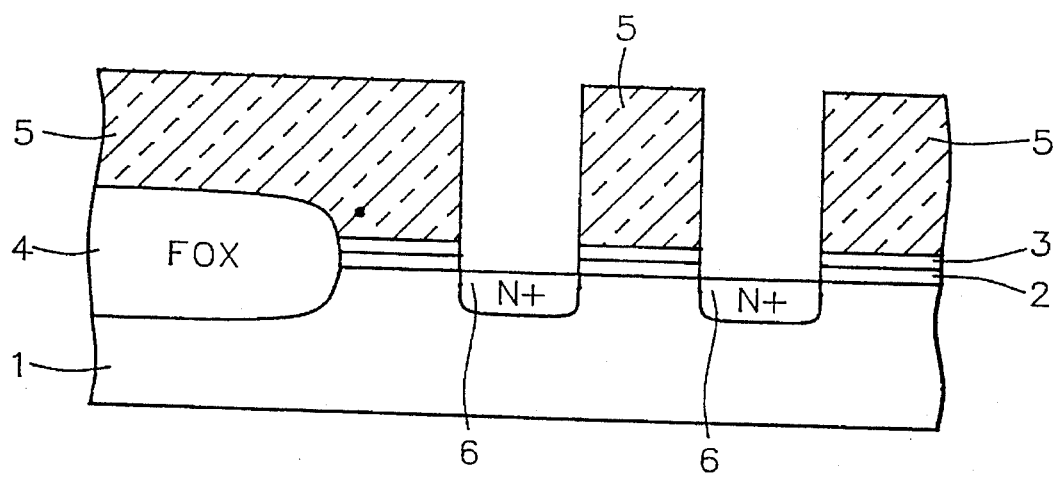
Figure 3:
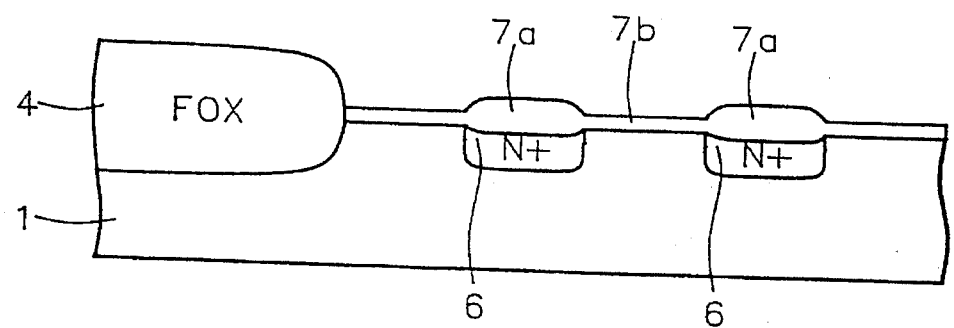

After removal of the masking silicon nitride layer, via a heated solution of phosphoric acid, conventional photolithographic techniques are employed to define a desired region of the substrate, to be used for the bit line regions. This is shown schematically in FIG. 2. An ion implantation process, using photoresist shape, 5, as a mask, is then performed to obtain the buried N+ bit lines, 6. The implantation procedure is accomplished using arsenic, at an energy between about 50 to 100 Kev., at a dose between about 1E14 to 1E16 atoms/cm2, and phosphorous, at an energy between about 30 to 60 Kev., at a dose between about 1E14 to 1E16 atoms/cm2. After photoresist removal, followed by specific organic and inorganic wet chemical cleans, an oxidation is next performed in wet O2 steam at a temperature between about 850° to 950° C. The oxidation results in a insulator layer, 7a, between about 800 to 2000 Angstroms on the N+ regions, while only between about 400 to 1000 Angstroms of silicon dioxide layer, 7b, is formed on the P type areas, between the N+ bit lines. This is illustrated in FIG. 3.

Figure 4:
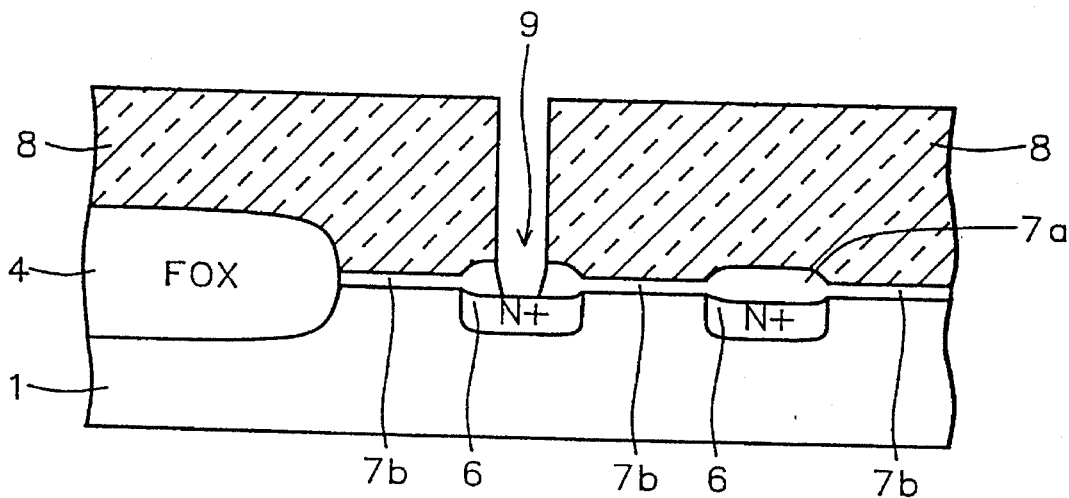
Figure 5:
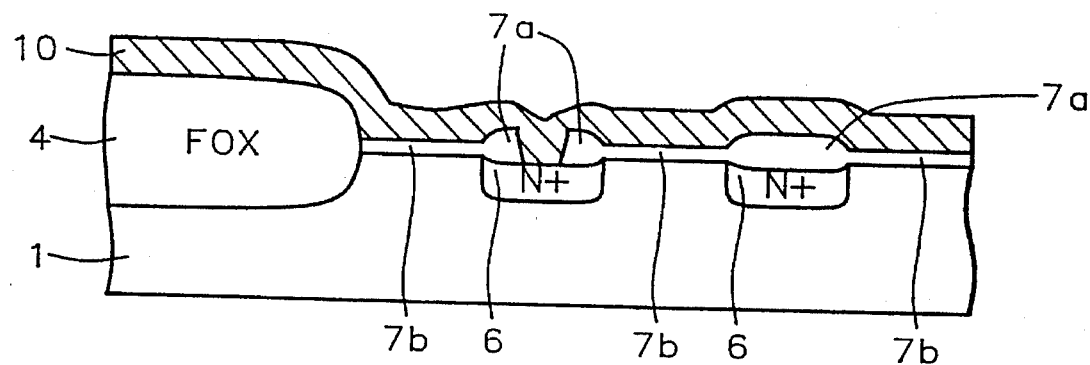
Figure 6:
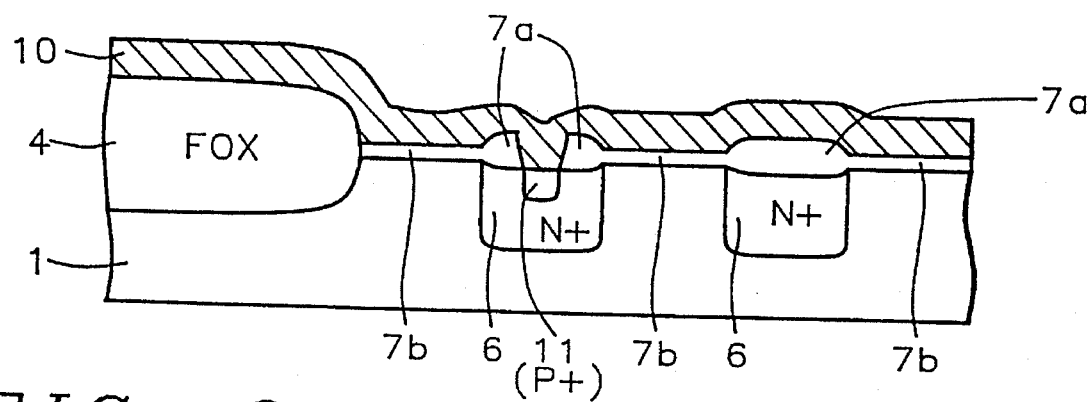

The fabrication of the programmable cell is next addressed. Photoresist shape, 8, is used to expose regions, 9, of specific bit lines. These regions are then subjected to a wet buffered hydrofluoric acid treatment, to remove the insulator from region 9. This can be seen in FIG. 4. After photoresist removal, again followed by specific wet organic and inorganic cleans, a polysilicon layer is deposited, using low pressure chemical vapor deposition, (LPCVD). The polysilicon layer, 10, shown in FIG. 5, is grown at a temperature between about 550° to 750° C., to a thickness between about 1200 to 1800 Angstroms. An ion implantation procedure is next performed to the blanket polysilicon layer, using boron, at an energy between about 30 to 60 Kev., at a dose between about 1E14 to 1E16 atoms/cm2. FIG. 6, shows the result of an anneal process, performed in nitrogen, at a temperature between about 850° to 950° C., for a time between about 30 to 60 min. This anneal allows the implanted boron, 11, in polysilicon, 10, to diffuse into the N+ region 6, creating a P/N diode, in specific bit regions. It should be noted that the level of performance of the P/N diode, and consequently that of the ROM device, is a function of the contrast in doping levels of the P and N type regions. Therefore if for resistance reasons, higher N+ bit line concentrations are needed, appropriate increases in the P type emitter doping levels have to be made.

Figure 7:
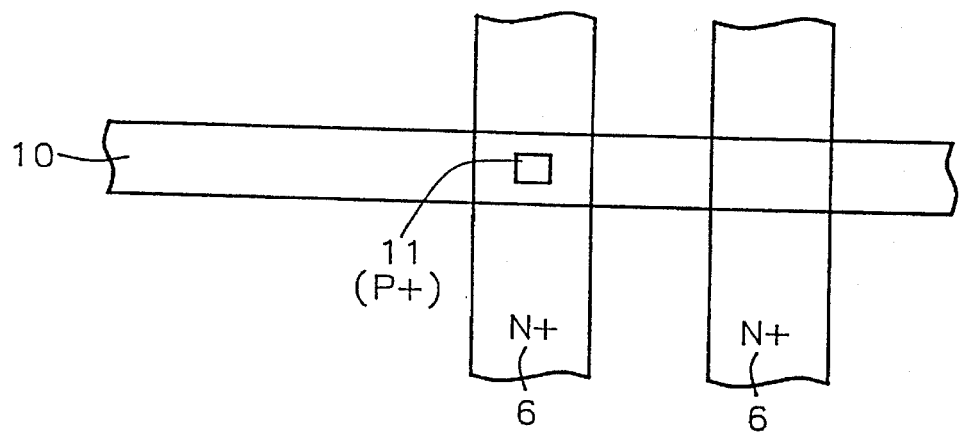
FIG. 7, which shows a top view of the new ROM device.
Figure 8:
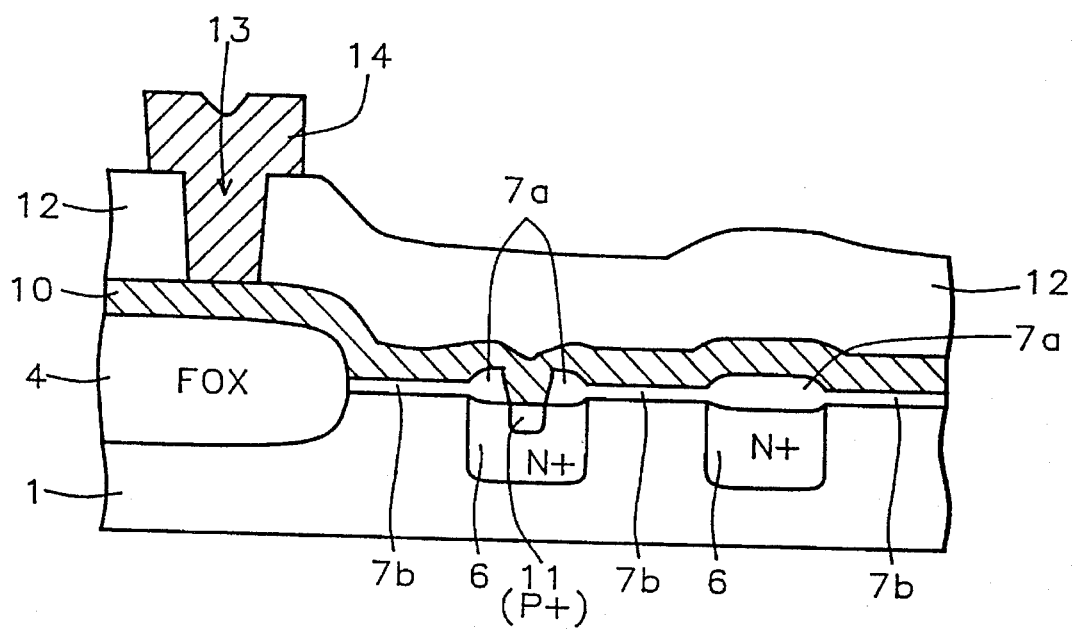
FIG. 8, which schematically illustrates a cross-sectional representation of the metallized ROM device.

Photolithographic and reactive ion etching procedures are then used to pattern polysilicon layer, 10, to create the desired word line configuration. FIG. 7, illustrates a top view of the ROM device, using a P/N diode, in specific regions of N+ bit lines. FIG. 8, schematically illustrates a metallized ROM, using the P/N diode for the programmable cell. A layer of silicon oxide, 12, is deposited to a thickness between about 6000 to 8000 Angstroms. Next photolithographic and reactive ion etching processing are used to open vias, 13, to the polysilicon word line, 10, and to the N+ buried bit line, 6, (not shown). Deposition of Al—Si—Cu is accomplished using sputtering to a thickness between about 8000 to 10000 Angstroms. Finally, photolithographic and reactive ion etching techniques are used to create metal contacts, 14.

This process, the creation of a ROM device using a P/N diode for the programmable cell, can be applied to N type as well as to P type devices. It can also be used as part of complimentary metal oxide semiconductor, (CMOS), and bipolar-CMOS, (BiCMOS), structures.

While this invention has been particularly shown and described with reference to the preferred embodiments thereof, it will be understood by those skilled in the art that various changes in form and details may be made without departing from the spirit and scope of this invention.

What is claimed is:

1. A read only memory, (ROM), device structure, comprising:

a device region on a surface of a semiconductor substrate;

alternate rows of N+ regions in said device region;

alternate rows of non-N+ regions in said device region;

thick oxide layers on said N+ regions;

thin oxide layers on said non N+ regions;

a contact hole, in one of said thick oxide regions, to one of said N+ regions;

P-type polysilicon within said contact hole forming a P/N junction with said one of said N+ regions; and a polysilicon gate structure overlying said thick field oxide and contacting said P-type polysilicon within said contact hole.

2. The ROM device structure of claim 1, wherein said thick oxide, on said N+ regions is between about 800 to 2000 Angstroms.

3. The ROM device structure of claim 1, wherein said thin oxide, on said non N+ regions is between about 400 to 1000 Angstroms.

4. The ROM device of claim 1, wherein said polysilicon gate structure is doped P-type.

* * * * *